(12) United States Patent
Blake et al.

(10) Patent No.: US 9,082,804 B2
(45) Date of Patent: Jul. 14, 2015

(54) TRIBOELECTRIC CHARGE CONTROLLED ELECTROSTATIC CLAMP

(75) Inventors: Julian Blake, Gloucester, MA (US); Dale K. Stone, Lynnfield, MA (US); Lyudmila Stone, Lynnfield, MA (US); David Suuronen, Newburyport, MA (US); Shigeo Oshiro, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 577 days.

(21) Appl. No.: 13/021,838

(22) Filed: Feb. 7, 2011

(65) Prior Publication Data

US 2012/0200980 A1 Aug. 9, 2012

(51) Int. Cl.
*H01L 21/683* (2006.01)

(52) U.S. Cl.
CPC .................................. *H01L 21/6831* (2013.01)

(58) Field of Classification Search
CPC ............................. H01L 21/6833; H02N 13/00
USPC ......................................................... 361/234
See application file for complete search history.

(56) References Cited

U.S. PATENT DOCUMENTS

| 5,452,177 | A | 9/1995 | Frutiger |
| 6,388,861 | B1 | 5/2002 | Frutiger |
| 7,623,334 | B2 | 11/2009 | Mizuno et al. |
| 7,724,493 | B2 | 5/2010 | Mizuno et al. |
| 7,848,077 | B2 | 12/2010 | Mizuno et al. |
| 2005/0134828 | A1 | 6/2005 | Ottens et al. |
| 2009/0168292 | A1* | 7/2009 | Watanabe et al. ............. 361/234 |
| 2010/0061032 | A1* | 3/2010 | Hirahara et al. ............. 361/234 |
| 2010/0265631 | A1 | 10/2010 | Stone et al. |
| 2011/0026187 | A1* | 2/2011 | Reynolds ..................... 361/234 |

FOREIGN PATENT DOCUMENTS

WO 2010085466 A1 7/2010

* cited by examiner

*Primary Examiner* — Thienvu Tran
*Assistant Examiner* — Ann Hoang

(57) ABSTRACT

An electrostatic clamp which more effectively removes built up charge from a substrate prior to removal is disclosed. Currently, the lift pins and the ground pins are the only mechanism used to remove charge from the substrate after implantation. The present discloses describes an electrostatic chuck in which the top dielectric surface has an embedded conductive region, such as a ring shaped conductive region in the sealing ring. Thus, regardless of the orientation of the substrate during release, at least a portion of the substrate will contain the conductive region on the dielectric layer of the workpiece support. This conductive region may be connected to ground through the use of conductive vias in the dielectric layer. In some embodiments, these conductive vias are the fluid conduits used to supply gas to the back side of the substrate.

16 Claims, 9 Drawing Sheets

US 9,082,804 B2

TRIBOELECTRIC CHARGE CONTROLLED ELECTROSTATIC CLAMP

FIELD

This disclosure relates to a substrate handling, and more particularly to an apparatus and a method of handling a substrate.

BACKGROUND

An electronic device may be created from a substrate that has undergone various processes. One of these processes may include introducing impurities or dopants to alter the electrical properties of the original substrate. For example, charged ions, as impurities or dopants, may be introduced to a substrate, such as a silicon wafer, to alter electrical properties of the substrate. One of the processes that introduces impurities to the substrate may be an ion implantation process.

An ion implanter is used to perform ion implantation or other modification of a substrate. A block diagram of a conventional ion implanter is shown in FIG. 1. The conventional ion implanter may comprise an ion source 102 that may be biased by a power supply 101. The system may be controller by controller 120. The operator communicates with the controller 120 via user interface system 122. The ion source 102 is typically contained in a vacuum chamber known as a source housing (not shown). The ion implanter system 100 may also comprise a series of beam-line components through which ions 10 pass. The series of beam-line components may include, for example, extraction electrodes 104, a 90° magnet analyzer 106, a first deceleration (D1) stage 108, a 70° magnet collimator 110, and a second deceleration (D2) stage 112. Much like a series of optical lenses that manipulate a light beam, the beam-line components can manipulate and focus the ion beam 10 before steering it towards a substrate or wafer 114, which is disposed on a substrate support 116.

In operation, a substrate handling robot (not shown) disposes the substrate 114 on the substrate support 116 that can be moved in one or more dimensions (e.g., translate, rotate, and tilt) by an apparatus, sometimes referred to as a "roplat" (not shown). Meanwhile, ions are generated in the ion source 102 and extracted by the extraction electrodes 104. The extracted ions 10 travel in a beam-like state along the beam-line components and implanted on the substrate 114. After implanting ions is completed, the substrate handling robot may remove the substrate 114 from the substrate support 116 and from the ion implanter 100.

Referring to FIGS. 2A and 2B, there is shown a block diagram illustrating the workpiece support 116 supporting the substrate 114 during the ion implantation process. As illustrated in FIG. 2A, the workpiece support 116 may comprise a sealing ring 202 and a plurality of embossments 204 that are in contact with the substrate 114. The sealing ring may be an annular ring of about 0.25 inches in width, and having a height of 5 microns. The embossments 204 may be about 1 mil in diameter and 5 microns high. In addition, the workpiece support 116 may also include at least one cooling region 206. During the implantation process, cooling gas may be provided to the cooling region 206 prevent the substrate 114 from overheating. The workpiece support 116 may have gas channels and conduits to allow this cooling gas to flow to the cooling region 206. The workpiece support 116 may further include a plurality of lift pins 208 that may move so as to push the substrate 114 away from the workpiece support 116 in the direction indicated by the arrows. The lift pins 208 may be retracted within the workpiece support 116, as illustrated in FIG. 2B. The workpiece would also be normally in contact with a plurality of ground pins 205.

The workpiece support 116 may be cylindrical in shape, such that its top surface is circular, so as to hold a disc-shaped substrate. Of course, other shapes are possible. To effectively hold the substrate 114 in place, most workpiece supports typically use electrostatic force. By creating a strong electrostatic force on the upper side of the workpiece support 116, the support can serve as the electrostatic clamp or chuck, and the substrate 114 can be held in place without any mechanical fastening devices. This minimizes contamination, avoids wafer damage from mechanical clamping and also improves cycle time, since the substrate does not need to be unfastened after it has been implanted. These clamps typically use one of two types of force to hold the substrate in place: coulombic or Johnsen-Rahbek force.

As seen in FIG. 2A, the clamp 116 traditionally consists of several layers. The first, or top, layer 210, which contacts the substrate 114, is made of an electrically insulating or semiconducting material, such as alumina, since it must produce the electrostatic field without creating a short circuit. In some embodiments, this layer is about 4 mils thick. For those embodiments using coulombic force, the resistivity of the top layer 210, which is typically formed using crystalline and amorphous dielectric materials, is typically greater than $10^{14}$ Ω-cm. For those embodiments utilizing Johnsen-Rahbek force, the volume resistivity of the top layer, which is formed from a semiconducting material, is typically in the range of $10^9$ to $10^{12}$ Ω-cm. The term "non-conductive" is used to describe materials in either of these ranges, and suitable for creating either type of force. The coulombic force can be generated by an alternating voltage (AC) or by a constant voltage (DC) supply.

Directly below this layer is a conductive layer 212, which contains the electrodes that create the electrostatic field. This conductive layer 212 is made using electrically conductive materials, such as silver. Patterns are created in this layer, much like are done in a printed circuit board to create the desired electrode shapes and sizes. Below this conductive layer 212 is a second insulating layer 214, which is used to separate the conductive layer 212 from the lower portion 220.

The lower portion 220 is preferably made from metal or metal alloy with high thermal conductivity to maintain the overall temperature of the workpiece support 116 within an acceptable range. In many applications, aluminum is used for this lower portion 220. Other materials, including matrix materials, such as composite materials or ceramics may also be used.

Initially, the lift pins 208 are in a lowered position. The substrate handling robot 250 then moves a substrate 114 to a position above the workpiece support 116. The lift pins 208 may then be actuated to an elevated position (as shown in FIG. 2A) and may receive the substrate 114 from the substrate handling robot 250. Thereafter, the substrate handling robot 250 moves away from the workpiece support 116 and the lift pins 208 may recede into the workpiece support 116 such that the sealing ring 202 and the embossments 204 of the workpiece support 116 may be in contact with the substrate 114, as shown in FIG. 2B. The ground pins 205 (if used) may in contact with the substrate 114. The implantation process may then be performed with the lift pins 208 in this recessed position. After the implantation process, the substrate 114 is unclamped from the workpiece support 116, having been held in place by electrostatic force. The lift pins 208 may then be extended into the elevated position, thereby elevating the substrate 114 and separating the substrate 114 from the sealing ring 202 and the embossments 204 of the workpiece support 116, as shown in FIG. 2A. In some embodiments, the lift pins 208 are insulating and therefore may not remove any remaining charge from the substrate 114. In other embodiments, the lift pins are conductive, such as metallic. The substrate handling robot 250 may then be disposed under the substrate 114, where it can retrieve the implanted substrate 114 at the elevated position. The lift pins 208 may then be lowered, and the robot 250 may then be actuated so as to remove the substrate 114 from the implanter.

A condition that can occur with a conventional ion implanter 100 may be found in the process of removing the substrate 114 from the workpiece support 116. After multiple cycles of clamping and unclamping a substrate 114 to a workpiece support 116, the side of the substrate 114 clamped to the workpiece support 116 may exhibit damage. This damage may be due to electrical discharge caused by electrostatic charge buildup on the substrate 114 and the top layer 210 of the workpiece support 116. The electrostatic charge may discharge (arc) to a ground pin 205 or directly to the surface of the workpiece support 116.

Previously, substrates 114 have been grounded via contact with metal lift pins 208 or ground pins 205. Substrates 114 also have been grounded previously using a plasma flood gun (PFG). Due to the brief contact time and small contact area between the lift pins 208 or ground pins 205 and the substrate 114 area containing the electrostatic charge, a condition can exist wherein the lift pins 208 and ground pins 205 do not effectively drain the electrostatic charge from the substrate 114. These ground pins may also cause damage to the backside of the substrate 114, and may not stay in contact during the entire release sequence. Therefore, the ground pins 205 may successfully ground the substrate 114 during processing or while the substrate 114 is clamped, but may not be able to do so during the wafer release process when the triboelectric charge is generated. Lift pins 208 can be used to release the substrate 114 from the workpiece support 116. These lift pins 208 may be a conductive metal and will successfully ground the substrate 114 during the entire release sequence. However, metal lift pins 208 can generate metal and particulate contamination as well as damage to the back side of the substrate 114 during release. Therefore, elastomeric lift pins 208 may be used to eliminate contamination and substrate surface damage, however, such pins are insulating and cannot ground the substrate 114 during the release sequence.

Accordingly, there is a need in the art for an improved electrostatic clamp that can remove charge, without introducing contamination or damage to the substrate.

SUMMARY

The problems of the prior art are overcome by the apparatus and method of this disclosure. An electrostatic clamp which more effectively removes built up charge from a substrate prior to removal is disclosed. Currently, the lift pins and the ground pins are the only mechanism used to remove charge from the substrate after implantation. The present disclosure describes an electrostatic chuck in which the top dielectric surface has an embedded conductive region, such as a ring shaped conductive region in the sealing ring. Thus, regardless of the orientation of the substrate during release, at least a portion of the substrate will contain the conductive region on the dielectric layer of the workpiece support. This conductive region may be connected to ground through the use of conductive vias in the dielectric layer. In some embodiments, these conductive vias are the fluid conduits used to supply gas to the back side of the substrate.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION

In the present disclosure, several embodiments of an apparatus and a method for handling a processed substrate are introduced. For purpose of clarity and simplicity, the present disclosure will focus on an apparatus and a method for handling a substrate that is processed by a beam-line ion implanter. Those skilled in the art, however, may recognize that the present disclosure is equally applicable to other types of processing systems including, for example, a plasma immersion ion implantation ("PIII") system, a plasma doping ("PLAD") system, a flood ion implanter, a focused plasma system, a system that modulates a plasma sheath, an etching system, an optical based processing system, and a chemical vapor deposition (CVD) system. As such, the present disclosure is not to be limited in scope by the specific embodiments described herein.

The embodiments disclosed herein provide a more reliable and lower resistance path to ground for a substrate and the top layer of an electrostatic clamp. Some portion of the substrate will be contacted to ground regardless of how or in what direction the substrate is released from the electrostatic clamp. By providing sufficient charge drainage from the backside surface of the substrate, substrate "sticking" to the electrostatic clamp and substrate breakage can be reduced.

Figure 3:
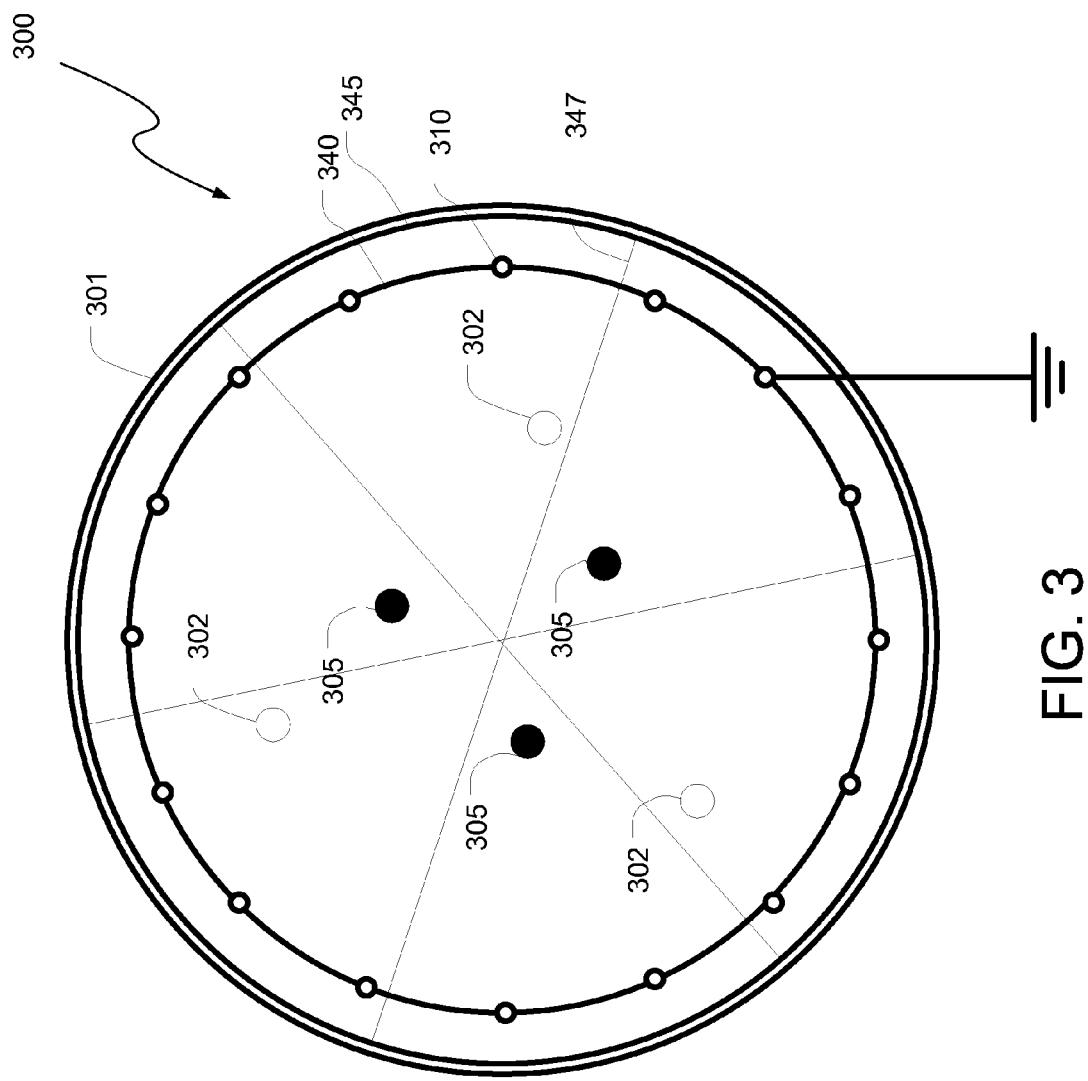
FIG. 3 represents a top view of an embodiment of an electrostatic clamp.

Referring to FIG. 3, the clamp 300 has an outer annulus or sealing ring 301. In one instance, the ring 301 may be approximately 0.25 inches in width. Although not shown, the upper surface of the clamp 300 may also have embossments. Lift pins 305 are used to lift the substrate from the clamp 300 after processing of the substrate has been completed. Metal pins 302 may be used to provide additional grounding for the substrate. In other embodiments, the metal pins 302 may be eliminated.

Figure 4:
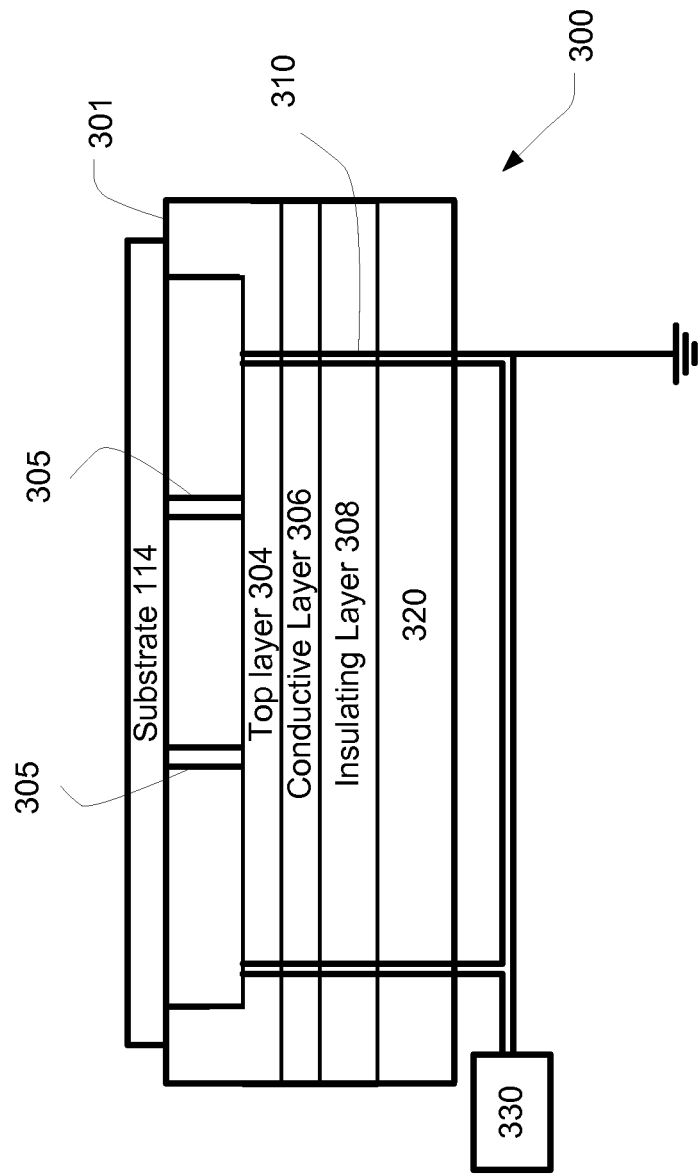
FIG. 4 represents a cross-sectional view of the embodiment of FIG. 3.

Fluid conduits 310 are used to provide gas to the back side of the substrate. These fluid conduits 310 pass through the platen 300, as shown in FIG. 4, and are connected to a gas source 330. In other words, the fluid conduits 310 may pass through the top layer 304, conductive layer 306, the insulating layer 308 and lower portion 320. In other embodiments, the fluid conduits 310 may exit the platen 300 at a location other than through the bottom, and therefore may not pass through all of these layers. The side walls of the fluid conduits 310 are made of conductive material, even in the non-conductive top layer 304, and the insulating layer 308. In addition, the conductive material used for the sidewalls of the fluid conduits 310 is electrically isolated from the material in conductive layer 306. In other words, the sidewalls of the fluid conduits 310 are electrically connected as they move from one layer to another, but are electrically isolated from the layers through which they pass. Conductive sidewalls may be created using existing technology, such as that used for printed circuit boards, which is known in the art. The sidewalls of the fluid conduits 310 may be electrically connected to the lower portion 320, which is typically grounded. In other embodiments, the sidewalls are electrically connected to a different ground point. In this way, it is possible to bring a ground connection to the top layer 304 of the platen 300, where that ground connection is embedded within the platen 300.

As seen in FIG. 3, the fluid conduits 310 may be arranged along a ring, which is concentric with the sealing ring 301, and has a smaller radius. In one embodiment, a conductive ring 340, located on the top surface, is used to link the sidewalls of these fluid conduits 310 together. This conductive ring 340 is connected to a plurality of the sidewalls of the fluid conduits 310. In some embodiments, the ring 340 is connected to all of the fluid conduits 310.

Figure 1:
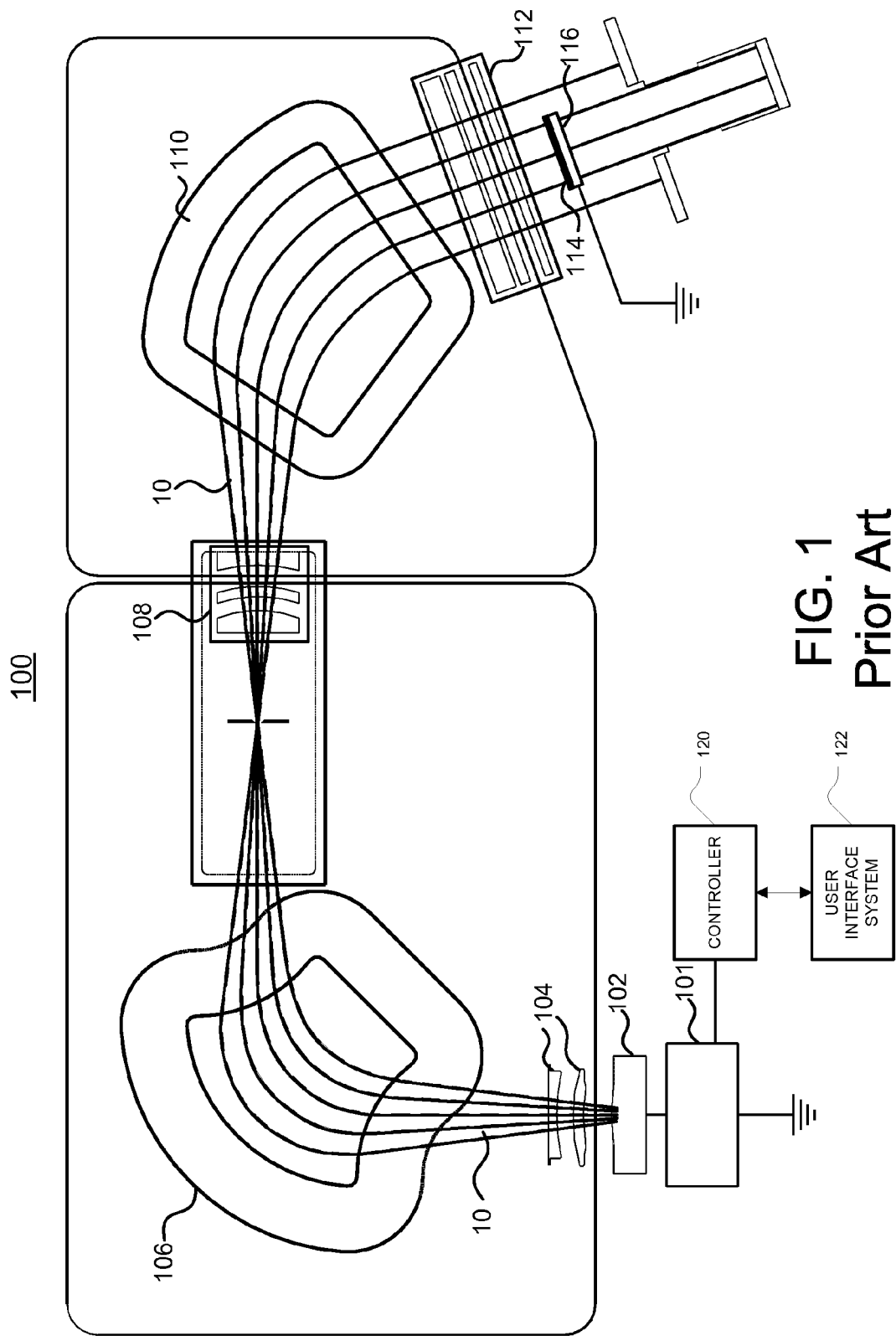
FIG. 1 represents a traditional ion implantation system.
Figure 2A:
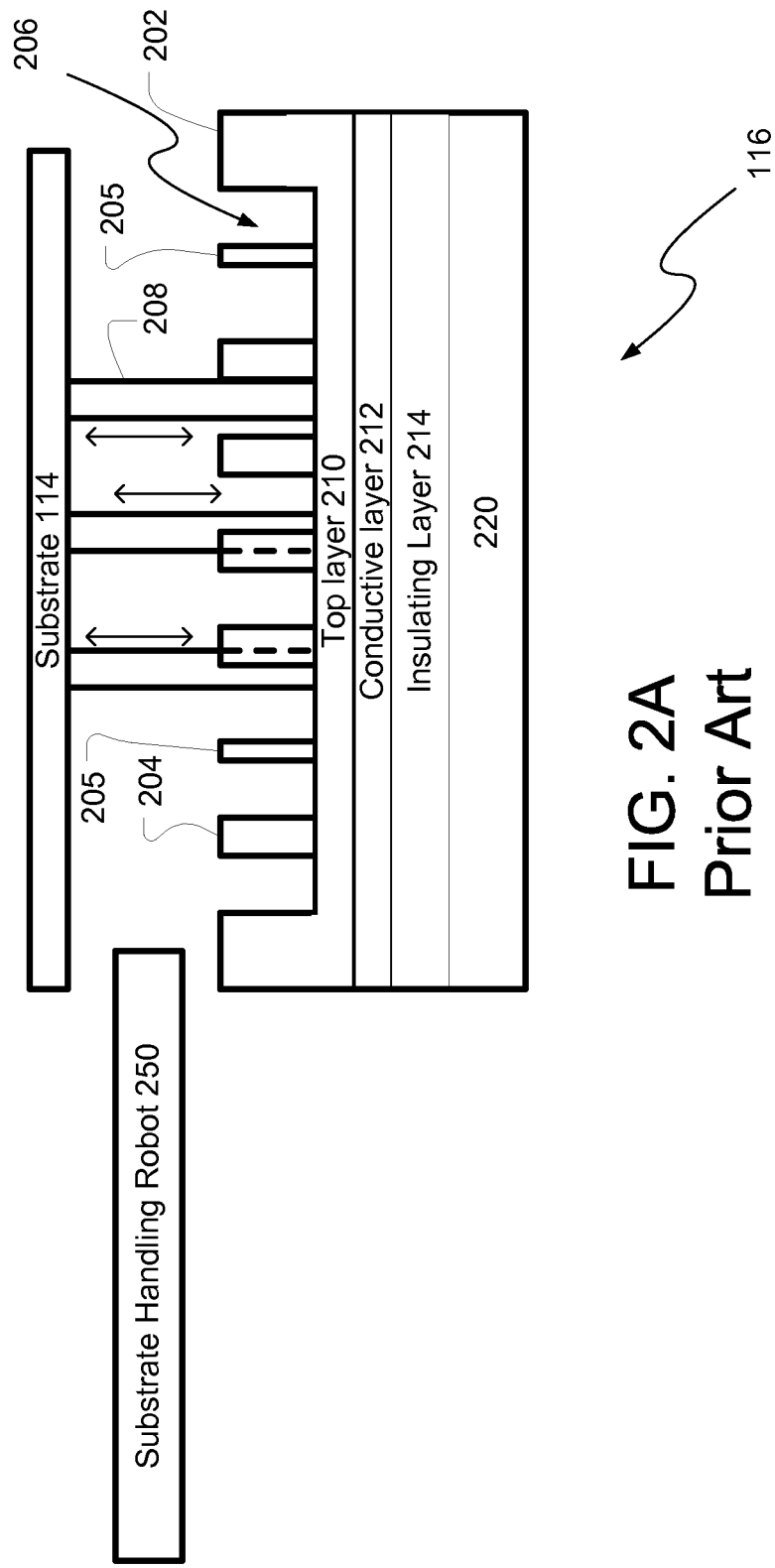
FIG. 2A represents a block diagram showing a workpiece support supporting a substrate with the lift pins extended.
Figure 2B:
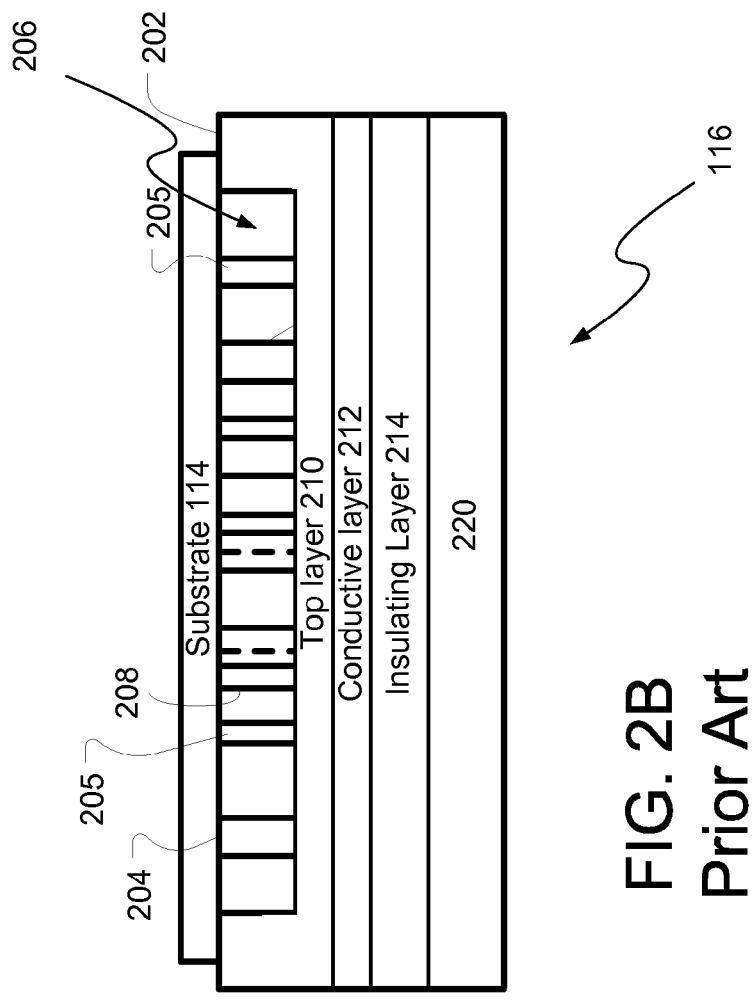
FIG. 2B represents a block diagram showing a workpiece support supporting a substrate with the lift pins recessed.

As is best seen in FIG. 2B, the sealing ring 301 contacts the substrate 114 during the processing of the substrate 114, as well as during the release. Therefore, it is important to provide one or more ground contacts on the sealing ring 301. In the embodiment shown in FIG. 3, a second conductive ring, or a conductive sealing ring, 345 is formed on the sealing ring 301 and is connected to conductive ring 340 through one or more conduits 347. In some embodiments, conduits 347 are spokes which extend across the diameter of the platen 300. In some embodiments, three conduits 347 are used, but the number of conduits is not limited to a particular number.

The use of conduits 347 serves several purposes. First, these conduits 347 provide redundant paths between the conductive ring 340 and the conductive sealing ring 345. In the event of a break in either conductive ring 340, 345, the conduits 347 provide alternate current paths. Secondly, these conduits 347 lower the effective resistance between the conductive ring 340 and the conductive sealing ring 345.

Figure 5:
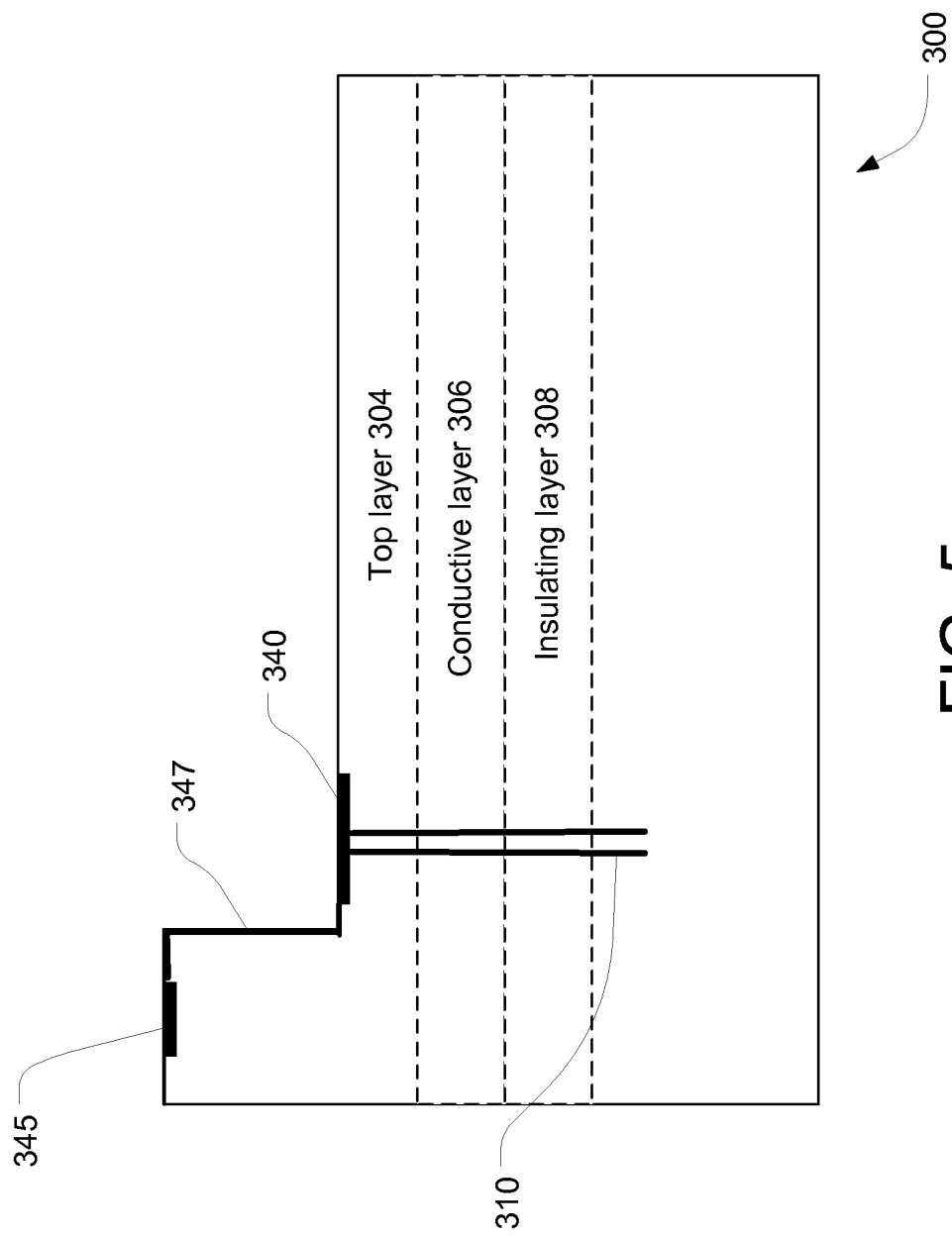
FIG. 5 represents an expanded view of FIG. 4.

FIG. 5 shows an expanded cross-sectional view, showing the electrical connection between the conductive ring 340 and the conductive sealing ring 345. In this embodiment, a conduit 347 electrically connects these rings 340, 345 together. The conductive ring 340 and conductive sealing ring 345 and the conduit 347 may be a conductive or semi-conductive material, such as pure aluminum or heavily doped DLC (diamond-like carbon). This material may be deposited on, or embedded in the top layer 304, such as by CVD (chemical vapor deposition) or PE CVD (plasma enhanced chemical vapor deposition). In one embodiment, a metal, such as aluminum, is deposited on the surface of the top layer 304. In other embodiments, the use of a metal conductive material may lead to contamination of semiconductor wafers. Therefore, in other embodiments, non-metallic conductors, such as diamond-like carbon (DLC) and silicon carbide (SiC) doped with nitrogen may be used. These non-metallic conductors may be deposited using PECVD. In other embodiments, a metal conductor is deposited on the top layer 304, and a non-metallic conductor is deposited on top of the metal. This reduces the risk of contamination and increases the conductivity of the electrical conduit.

FIG. 4 shows a cross-section view of the clamp 300 of FIG. 3. As described above, the lower portion 320 of the electrostatic clamp 300 is typically made of a metal, and is typically connected to ground. Therefore, in some embodiments, the sidewalls of the fluid conduits 310 are in contact with the lower portion 320 of the electrostatic clamp 300, and are grounded accordingly. In other embodiments, the sidewalls of the fluid conduits 310 are connected to a different ground source.

Figure 6:
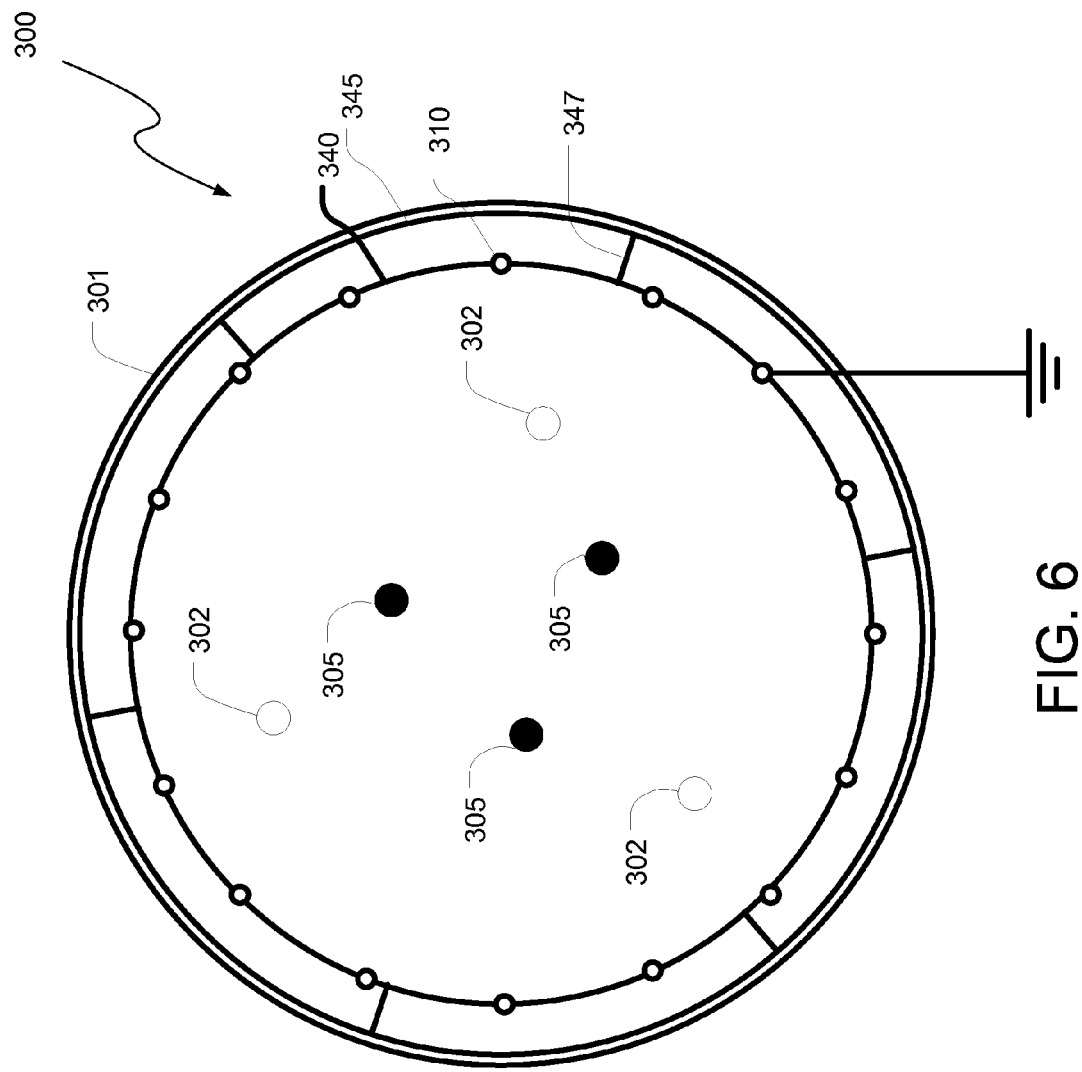
FIG. 6 represents a top view of a second embodiment of an electrostatic clamp.

FIG. 3 illustrates conduits 347 extending across the diameter of the electrostatic clamp 300. However, other embodiments are possible. For example, the conduits 347 may only extend outwardly from the conductive ring 340 to the conducting sealing ring 345, as shown in FIG. 6.

Figure 7:
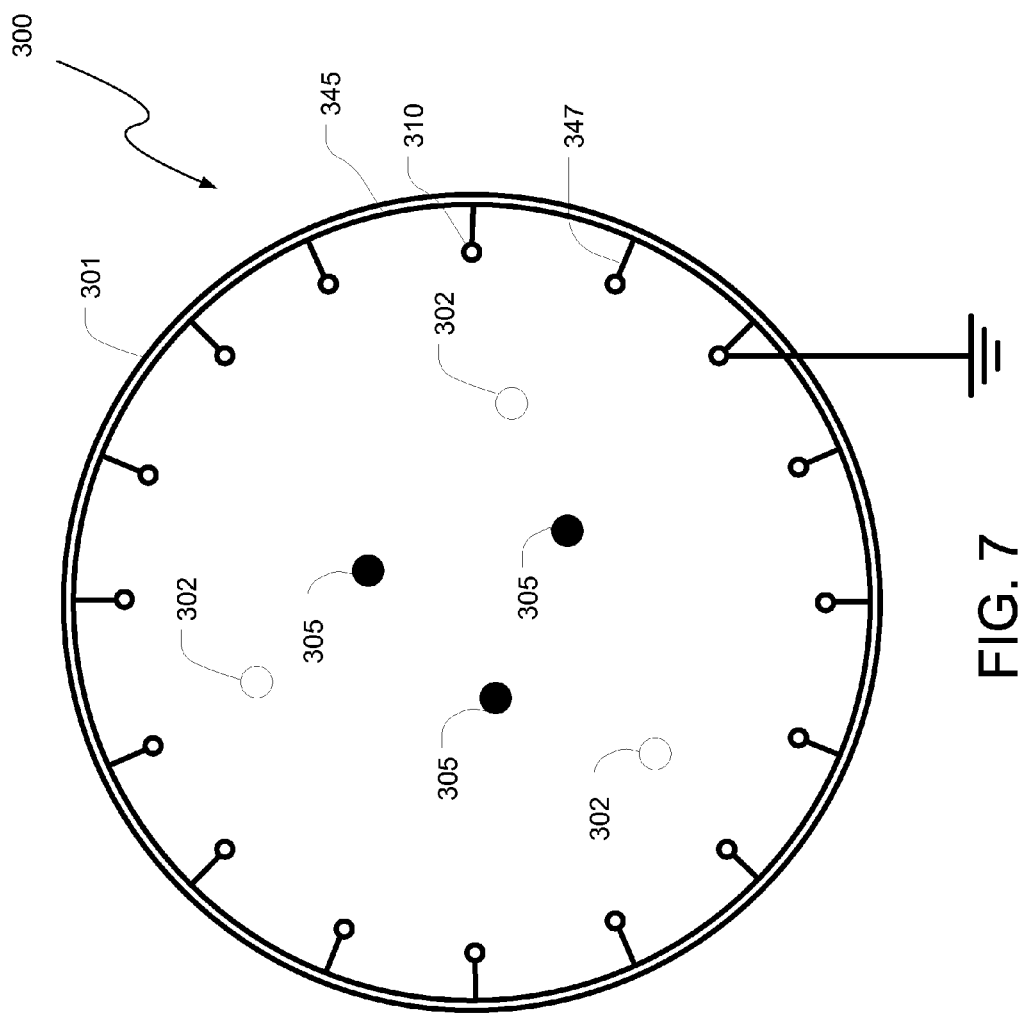
FIG. 7 represents a top view of another embodiment of an electrostatic clamp.

In another embodiment, the sidewalls of the fluid conduits 310 are in electrical contact with the conductive sealing ring 345, without the use of a conductive ring 340. FIG. 7 shows an embodiment in which the sidewall of each fluid conduit 310 is electrically connected to the sealing conductive ring 345. In other embodiments, a subset of the sidewalls is connected to the conductive sealing ring 345.

Other configurations which utilize the fluid conduits 310 to provide a ground connection to the top surface of the platen 300 may also be used and are within the scope of the disclosure.

In some embodiments, the conductive sealing ring 345 is permanently connected to ground. This is due to the generally high resistivity of the top surface 304, which limits the effect of the grounded sealing ring 345. However, in some embodiments, the sealing ring 345 may be intermittently connected to ground (i.e. active ground connection). For example, using a switch or other device, the ground connection to the fluid conduits 310 or to the conductive sealing ring 345 may be interrupted while the electrodes are actively generating an electrostatic field. In other words, the switch is in series between the sealing ring 345 and ground, such that actuation of the switch either enables or disables the connection to ground. When the electrodes 306 are inactive, the grounding connection may be restored. This modification insures that the grounding of the top surface 304 of the clamp 300 has minimal or no impact on the electrostatic clamp force.

Figure 8:
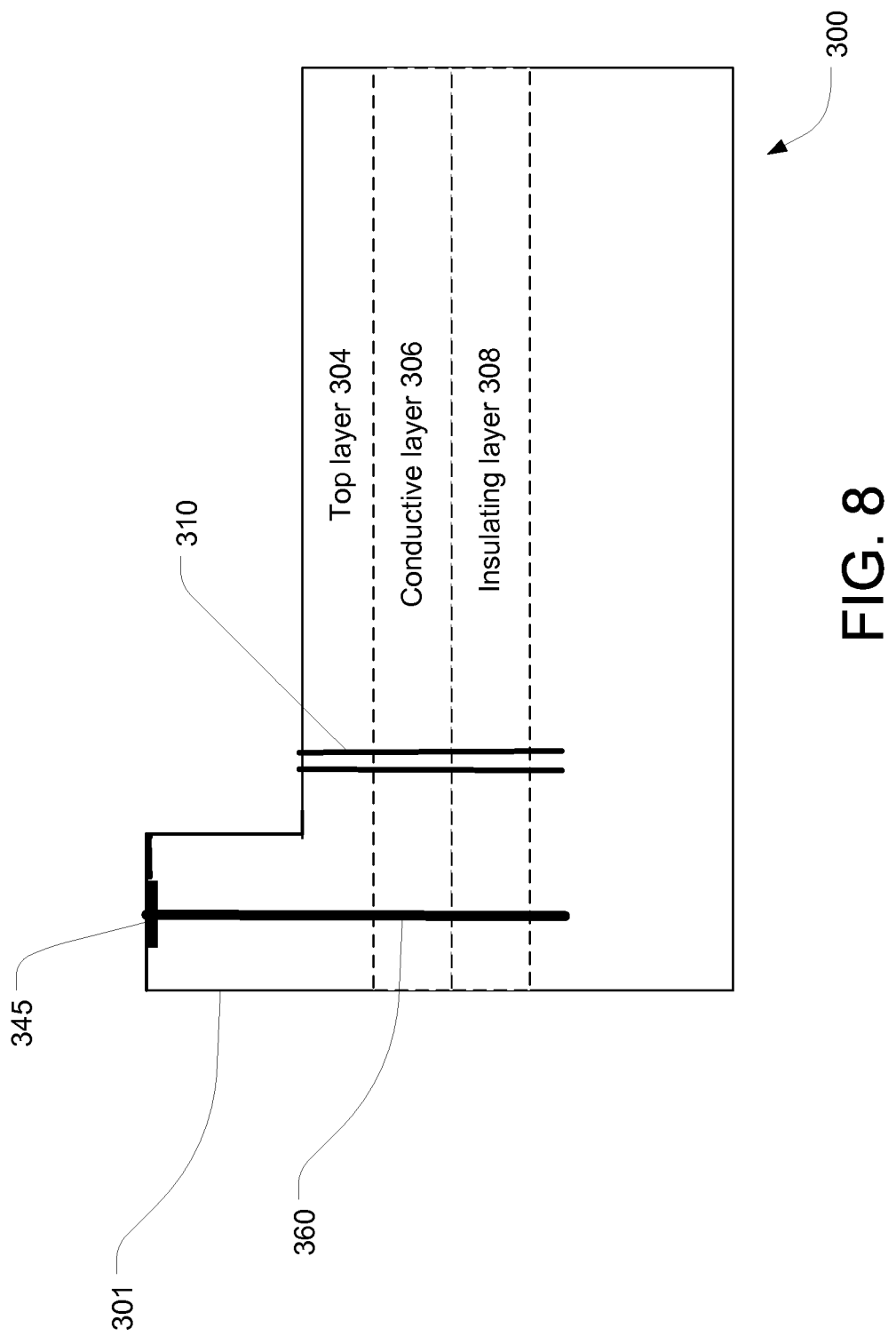
FIG. 8 represents a cross-sectional view of another embodiment of an electrostatic clamp.

While one embodiment utilizes the fluid conduits 310 to carry ground to the top layer 304, other embodiments are possible. For example, as seen in FIG. 8, conductive regions, different from the fluid conduits 310, may be used to form a conductive path 360 which may bring ground to the top layer 304. These regions may be embedded in the platen 300. For example, each layer may be formed such that a region of each layer 304,306,308 is made of a conductive material, such that, when assembled, the regions of conductive material are aligned and form a conductive path 360 to the top layer 304. These regions can be connected to the grounded lower portion 320, or another ground. In some embodiments, the regions are located such that the conductive path 360 terminates in the sealing ring 301. One or more regions can be used to form conductive paths 360 that connect ground to a conductive sealing ring 345. In another embodiment, the conductive path 360 is located away from the sealing ring 301, so that conductive conduits, such as conduits 347 (see FIG. 7) must be added to the top layer 304 to connect the conductive sealing ring 345 to conductive ground path 360. In other embodiments, the conductive path 360 is located along the outer edge of the platen 300.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. A clamp for handling a substrate, comprising:
a top layer, made of non-conductive material;
a gas source;
a conduit embedded in said clamp adapted to carry gas from said gas source to said top layer, wherein a sidewall of said conduit is made of a conductive material;
an outer sealing ring, surrounding said top layer and extending above said top layer for supporting the substrate a distance above said top layer;
an outer conductive ring disposed on the outer sealing ring, the outer conductive ring and the outer sealing ring each having a surface in direct contact with the substrate, the outer conductive ring and the outer sealing ring being the only portions of the clamp configured to engage the substrate; and
a first conductive material deposited on said top layer between said outer conductive ring and said sidewall of said conduit, wherein said sidewall is in communication with ground.

2. The clamp of claim 1, further comprising a second material deposited on top of said first conductive material.

3. The clamp of claim 2, wherein said first conductive material comprises metal and said second material comprises a non-metallic electrically conducting material.

4. The clamp of claim 1, further comprising a lower portion disposed beneath said top layer, wherein said lower portion comprises metal and is grounded, and said sidewall is in communication with said lower portion.

5. The clamp of claim 1, further comprising a plurality of conduits arranged in a ring, each having a conductive sidewall, and an inner conductive ring embedded in or deposited on said top layer, electrically connecting said sidewalls of said plurality of conduits.

6. The clamp of claim 5, comprising a plurality of connections between said inner conductive ring and said outer conductive ring.

7. The clamp of claim 5, wherein said plurality of connections extends across a diameter of said top layer.

8. The clamp of claim 1, wherein said clamp does not utilize ground pins.

9. A clamp for handling a substrate, comprising:
a top layer made of non-conductive material;
a conduit adapted to carry gas to said top layer, wherein a sidewall of said conduit is made of conductive material and is connected to ground;
an outer sealing ring extending around said top layer and extending above said top layer for supporting the substrate a distance above said top layer;
an outer conductive ring disposed on the outer sealing ring, the outer conductive ring and the outer sealing ring each having a surface in direct contact with the substrate, the outer conductive ring and the outer sealing ring being the only portions of the clamp configured to engage the substrate; and
a first conductive material deposited on an upper-most surface of said top layer and connecting said outer conductive ring to said sidewall of said conduit.

10. The clamp of claim 9, further comprising a second material deposited on top of said first conductive material.

11. The clamp of claim 10, wherein said first conductive material comprises metal and said second material comprises a non-metallic electrically conducting material.

12. The clamp of claim 9, further comprising a lower portion disposed beneath said top layer, wherein said lower portion comprises metal and is grounded and said sidewall is in communication with said lower portion.

13. The clamp of claim 9, further comprising a plurality of conduits arranged in a ring, each having a conductive sidewall, and an inner conductive ring embedded in or deposited on said top layer, electrically connecting said sidewalls of said plurality of conduits.

14. The clamp of claim 13, comprising a plurality of connections between said inner conductive ring and said outer conductive ring.

15. The clamp of claim 13, wherein said plurality of connections extends across a diameter of said top layer.

16. The clamp of claim 9, wherein said clamp does not utilize ground pins.

* * * * *